(12) United States Patent
Kasumi

(10) Patent No.: US 6,754,303 B2
(45) Date of Patent: Jun. 22, 2004

(54) EXPOSURE APPARATUS AND EXPOSING METHOD

(75) Inventor: Kazuyuki Kasumi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/214,605

(22) Filed: Aug. 9, 2002

(65) Prior Publication Data
US 2003/0035508 A1 Feb. 20, 2003

(30) Foreign Application Priority Data
Aug. 14, 2001 (JP) ........................................ 2001-246214

(51) Int. Cl.$^7$ ............................................... G21K 5/00
(52) U.S. Cl. ........................................................ 378/34
(58) Field of Search ............................................ 378/34

(56) References Cited

U.S. PATENT DOCUMENTS

| | | | | |
|---|---|---|---|---|
| 4,803,712 A | * | 2/1989 | Kembo et al. ................. | 378/34 |
| 4,896,341 A | | 1/1990 | Forsyth et al. ................. | 378/34 |
| 4,935,947 A | | 6/1990 | Amemiya .................... | 378/119 |
| 5,177,774 A | | 1/1993 | Suckewer et al. ............. | 378/43 |
| 5,453,001 A | | 9/1995 | Huang .......................... | 378/34 |
| 5,825,844 A | | 10/1998 | Miyake et al. ................. | 378/34 |
| 5,835,560 A | | 11/1998 | Amemiya et al. ............. | 378/34 |
| 5,923,719 A | | 7/1999 | Watanabe ..................... | 378/34 |
| 5,949,844 A | | 9/1999 | Watanabe ..................... | 378/34 |
| 6,381,005 B1 | | 4/2002 | Kasumi et al. ................. | 355/75 |
| 6,453,001 B2 | * | 9/2002 | Watanabe et al. ............. | 378/34 |

OTHER PUBLICATIONS

Pearlman, J.S., and J.C. Riordan, "X–ray lithography using a pulsed plasma source," *Journal of Vacuum Science Technology*, 19(4), Nov./Dec. 1981, pp. 1190–1193.

* cited by examiner

Primary Examiner—Craig E Church
(74) Attorney, Agent, or Firm—Fitzpatrick, Cella, Harper & Scinto (57) ABSTRACT

An X-ray exposure apparatus for transferring a mask pattern onto a substrate. The apparatus includes an X-ray source for generating X-ray light, an optical system which includes a collimator lens for generating parallel X-ray light for transferring a mask pattern to a substrate, from the X-ray source, a detection unit which detects a position of the X-ray source relative to a mask, and a correction unit which corrects a position and an attitude of the optical system on the basis of a detection result obtained by the detection unit.

15 Claims, 8 Drawing Sheets

| | |
|---|---|
| URL | http://www.maintain.co.jp/db/input.html |

TROUBLE DB INPUT WINDOW

DATA OF OCCURRENCE OF TROUBLE [2000/3/15] ~1404
MODEL [**********] ~1401
TROUBLE CASE NAME [OPERATION ERROR (START-UP ERROR)] ~1403
DEVICE S/N [465NS4580001] ~1402
EMERGENCY LEVEL [D] ~1405

PROBLEM: LED KEEPS FLICKERING AFTER POWER ON ~1406

REMEDY: POWER ON AGAIN (PRESS RED BUTTON IN ACTIVATION) ~1407

PROGRESS: INTERIM HAS BEEN DONE ~1408

[SEND] [RESET]

| 1410 | 1411 | 1412 |
|---|---|---|
| LINK TO RESULT LIST DATABASE | SOFTWARE LIBRARY | OPERATION GUIDE |

FIG. 7

EXPOSURE APPARATUS AND EXPOSING METHOD

FIELD OF THE INVENTION

The present invention relates to an exposure apparatus and method utilized in the manufacture of various types of devices, e.g., a semiconductor chip such as an IC or LSI, a display element such as a liquid crystal panel, a detection element such as a magnetic head, and an image sensing element such as a CCD.

BACKGROUND OF THE INVENTION

In recent years, as the packing density and operation speed of semiconductor integrated circuits increase, the pattern line width of the integrated circuits is decreased, and a higher-performance semiconductor manufacturing method is sought for. Accordingly, as an exposure apparatus used for resist pattern formation in the lithography process of the semiconductor fabrication process, a stepper utilizing extreme ultraviolet rays such as a KrF laser (248 nm), an ArF laser (193 nm), or an $F_2$ laser (157 nm), or a short-wavelength light beam such as X-rays (0.2 to 1.5 nm) has been developed.

In exposure using X-rays, among these light beams, a proximity exposure method of moving an X-ray mask having a desired pattern to be close to a resist-coated wafer, and irradiating the wafer with X-rays through the X-ray mask, thereby transferring the projected image of the mask pattern onto the wafer, has been developed.

In order to obtain high-intensity X-rays, an exposing method using synchrotron radiation is proposed. It is reported that, according to this method, a pattern of 100 nm or less can be transferred. A synchrotron radiation source requires large-scale facilities. A profit cannot be expected unless fabrication is performed by connecting ten or more exposure apparatuses to one light source. Hence, this method is suitable for application to a highly demanded device such as a semiconductor memory. In recent years, a device using GaAs has been put into practical use as a communication device, and a large decrease in line width is required. Communication devices are produced in an amount less than that of semiconductor memories, and many types of communication devices are produced in small amounts. When an X-ray exposure system using synchrotron radiation as the light source is introduced to the fabrication of communication devices, it will probably make no profit. For this reason, an exposure apparatus using a compact X-ray source which generates high-intensity X-rays is used in actual communication device production. The light source is called a laser plasma produced source, and ranges from one which generates a plasma by irradiating a target with a laser beam and uses X-ray beams generated from the plasma, to one which generates X-rays by generating a pinch plasma in a gas. These light sources are called point sources. According to a general exposure apparatus, one exposure apparatus main body which transfers a pattern by aligning a mask and wafer is connected to one point source.

Figure 3:
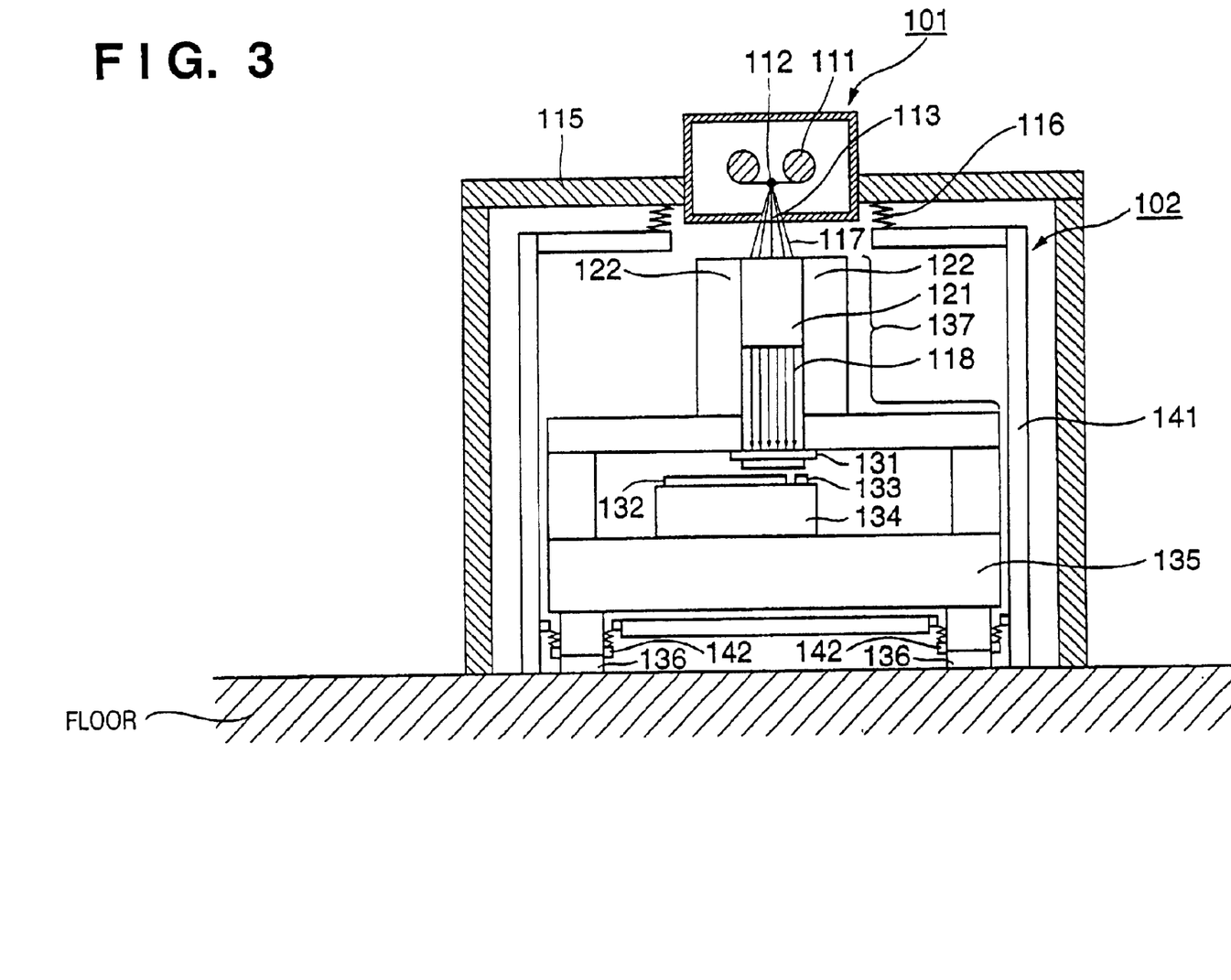
FIG. 3 is a view showing the schematic arrangement of a conventional point source X-ray stepper.

FIG. 3 shows the schematic arrangement of a conventional point source X-ray stepper. Reference numeral 101 denotes an X-ray source unit for generating X-rays. The interior of the X-ray source unit 101 is maintained in a vacuum state. The X-ray source unit 101 irradiates a target 111 with a laser beam (not shown) to generate a plasma, thus generating X-rays 117. The X-rays 117 globally diverge from a light source 112. Part of the X-rays 117 is guided into a reduced-pressure He chamber 141 through an X-ray extracting window 113. A collimator 121 is set in the reduced-pressure He chamber 141. The collimator 121 sets the incident divergent X-rays to be parallel, and outputs them at an exposure field (reference numeral 118). The X-rays 117 generated by the light source 112 are divergent light beams. At an exposure position away from the light source 112, the intensity of the X-rays 117 decreases in inverse proportion to the distance. Hence, to obtain X-rays as much as possible to increase the intensity of the X-rays for exposure is one of the roles of the collimator 121.

A mask 131 has a transfer pattern on its membrane (not shown). A wafer 132 coated with a photosensitive agent is positioned at a position with a small gap of about 10 μm from the membrane by an alignment unit (not shown). The wafer 132 is irradiated with the X-rays 118 emerging from the collimator 121, so the pattern is transferred to the wafer 132. The wafer 132 is sequentially stepped by a wafer stage 134 and is exposed successively.

The exposure apparatus is mainly comprised of the light source unit 101 and a main body 102. The X-ray source unit 101 is set on a light source unit frame 115 and is installed on the floor independently of the main body 102. This prevents heat generated by the light source 112 from being transmitted through the frame to thermally distort the main body 102, leading to a decrease in alignment precision of the mask 131 and wafer 132. This also facilitates installation of the apparatus by supporting the X-ray source unit 101 and main body 102 by different structures.

The target 111 is arranged in the X-ray source unit 101, and is irradiated with a laser beam (not shown) to generate a plasma, thereby generating the X-rays 117. The interior of the X-ray source unit 101 is a vacuum and is isolated from the reduced pressure He atmosphere of the main body 102 by the Be-made X-ray extracting window 113 with a thickness of several μm. Thus, the vacuum atmosphere in the X-ray source unit 101 will not be spoiled. Beryllium has a high X-ray transmittance but does not transmit He, so Be is used to form the X-ray extracting window 113. A bellows A (reference numeral 116) is set between the X-ray source unit 101 and reduced-pressure He chamber 141 to isolate them from the outside.

The main body 102 is set in the reduced-pressure He chamber 141, and is entirely maintained with the reduced-pressure He atmosphere by an He atmosphere creating unit (not shown). This is because attenuation of the X-rays can be suppressed by setting the atmosphere where the X-rays as the exposure light pass to reduced-pressure He. The main body 102 is comprised of the collimator 121 of an illumination optical system, a mask stage (not shown) for holding and positioning the mask 131, the wafer stage 134 for holding, positioning, and stepping the wafer 132, a transfer system (not shown) for transferring the mask 131 and wafer 132, and a measurement system (not shown) for measuring the positions of the mask 131 and wafer 132. The main body 102 is installed on the floor through vibration damping units 136. A stage surface plate 135 is set on the vibration damping units 136, and the wafer stage 134 moves on it. A main body frame 137 is set on the stage surface plate 135, and the collimator 121 is fixed to the main body frame 137. When the collimator 121 is to be assembled and adjusted, it is built with its position and attitude being adjusted such that the X-rays 118 have a uniform intensity distribution on the mask surface and become incident on the mask 131 to be perpendicular to it.

The vibration damping units 136 prevent the positioning precisions of the mask 131 and wafer 132, that require precise positioning, from being decreased by vibration from the floor, so the main body 102 maintains a constant attitude. As the vibration damping units 136 are formed of pneumatic springs, it is difficult to remove low-frequency vibration (vibration of several Hertz or less) with them.

Bellows B (reference numeral 142) are set between the reduced-pressure He chamber 141 and main body 102 so the reduced-pressure He atmosphere will not be spoiled when the attitude of the main body 102 changes.

With the arrangement of the conventional case, when the position of the light source 112 undesirably shifts, its position relative to the collimator 121 of the illumination optical system changes. Then, the X-ray intensity and uniformity on the mask surface, and the exposure optical axis change undesirably. When the X-ray intensity on the mask surface is nonuniform, the resolution line width within the exposure field varies. When the optical axis changes undesirably, the pattern is transferred with a shift, degrading overlay accuracy. Either case will decrease the yield in the device fabrication.

The position of the light source 112 may relatively shift when the frame 115 of the X-ray source unit 101 deforms by a thermal change. Also, when the wafer stage 134 is stepped, the main body 102 itself swings by the driving reaction force. Since the collimator 121 serving as the illumination optical system is set on the main body 102, when the wafer stage 134 is stepped, the collimator 121 swings together with the wafer stage 134 and the like. Hence, the positional relationship between the light source 112 and the collimator 121 of the illumination optical system changes. With the attitude of the main body 102 left changed, the exposure light intensity becomes nonuniform. Thus, the next exposure must wait until the attitude of the main body 102 converges. In this respect, the throughput has room for improvement.

SUMMARY OF THE INVENTION

The present invention has been made in view of the above problems, and has as its object to provide an exposure apparatus and method with which the transfer position precision of the projection image of a mask pattern is increased, so a finer micropatterned semiconductor device can be fabricated while improving the throughput.

In order to solve the above problems and to achieve the above object, an exposure apparatus according to the present invention has an illumination optical system which generates exposure light by setting to a desired state X-rays emitted from an X-ray source that generates X-rays, and transfers a mask pattern onto a substrate. The exposure apparatus comprises a detection unit for detecting a position of the X-ray source relative to a mask, and a correction unit for correcting a position and attitude of the illumination optical system on the basis of a detection result obtained by the detection unit such that an exposure intensity becomes uniform within a predetermined allowable range. The exposure apparatus also corrects the positions of the mask and wafer relative to each other so as to correct a change in exposure optical axis.

An exposing method according to the present invention uses an illumination optical system which generates exposure light by setting to a desired state X-rays emitted from an X-ray source that generates X-rays, and transfers a projection image of a mask pattern onto a substrate. The exposure method comprises the steps of detecting a position of the X-ray source relative to a mask, and correcting a position and attitude of the illumination optical system on the basis of a detection result such that an exposure intensity becomes uniform. Also, the positions of the mask and wafer relative to each other are corrected so as to correct a change in exposure optical axis.

Preferably, this correction is performed such that an exposure intensity becomes uniform within a predetermined allowable range.

Preferably, positions of the mask and substrate relative to each other are corrected on the basis of the detection result.

Preferably, this exposure is proximity X-ray exposure.

The present invention has an illumination optical system which generates exposure light by setting to a desired state X-rays emitted from an X-ray source that generates X-rays. When transferring the projection image of a mask pattern onto a substrate with the exposure light, the position of the X-ray source relative to a mask is detected, and the position and attitude of the illumination optical system are corrected on the basis of a detection result. Thus, the precision of the transfer position of the projection image of the mask pattern is improved. A finer micropatterned semiconductor device can be fabricated while increasing the throughput.

The present invention can also be applied to a semiconductor device fabricating method comprising the steps of setting a group of fabrication apparatuses for performing respective types of processes, including any one of the above exposure apparatuses, at a semiconductor fabrication factory, and fabricating a semiconductor device in accordance with a plurality of processes by using the group of fabrication apparatuses. The method preferably further comprises the steps of connecting the group of fabrication apparatuses to each other through a local area network, and data-communicating information on at least one of the group of fabrication apparatuses between the local area network and an external network outside the semiconductor fabrication factory. Preferably, maintenance information on the fabrication apparatuses is obtained through data communication by accessing a database provided by a vendor or user of the exposure apparatus through the external network, or production management is performed by data communication with another semiconductor fabrication factory through the external network.

The present invention can also be applied to a semiconductor fabrication factory comprising a group of fabrication apparatuses for performing respective types of processes, including any one of the above exposure apparatuses, a local area network for connecting the group of fabrication apparatuses, and a gateway for enabling access to an external network outside the factory from the local area network, wherein data communication of information on at least one of the group of fabrication apparatuses is enabled.

The present invention also provides a maintenance method for any one of the above exposure apparatuses, which is set on a semiconductor fabrication factory. The maintenance method may be characterized by comprising the steps of providing, by a vendor or user of the exposure apparatus, a maintenance database connected to an external network outside the semiconductor fabrication factory, allowing access to the maintenance database from inside the semiconductor fabrication factory through the external network, and transmitting maintenance information accumulated in the maintenance database to the semiconductor fabrication factory through the external network.

According to the present invention, any one of the above exposure apparatuses may be characterized in that the exposure apparatus further comprises a display, a network interface, and a computer for performing network software, and data communication of maintenance information on the exposure apparatus through a computer network is enabled. Preferably, the network software provides a user interface for accessing a maintenance database, connected to an external network outside a factory where the exposure apparatus is set and provided by a vendor or user of the exposure apparatus, on the display, so information can be obtained from the database through the external network.

Other objects and advantages, besides those discussed above, shall be apparent to those skilled in the art from the description of a preferred embodiment of the invention which follows. In the description, reference is made to accompanying drawings, which form a part thereof, and which illustrate an example of the invention. Such an example, however, is not exhaustive of the various embodiments of the invention, and, therefore, reference is made to the claims which follow the description for determining the scope of the invention.

DETAILED DESCRIPTION OF THE PREFERRED EMBODIMENTS

The preferred embodiments of the present invention will be described in detail with reference to the accompanying drawings.

[First Embodiment]

Figure 1:
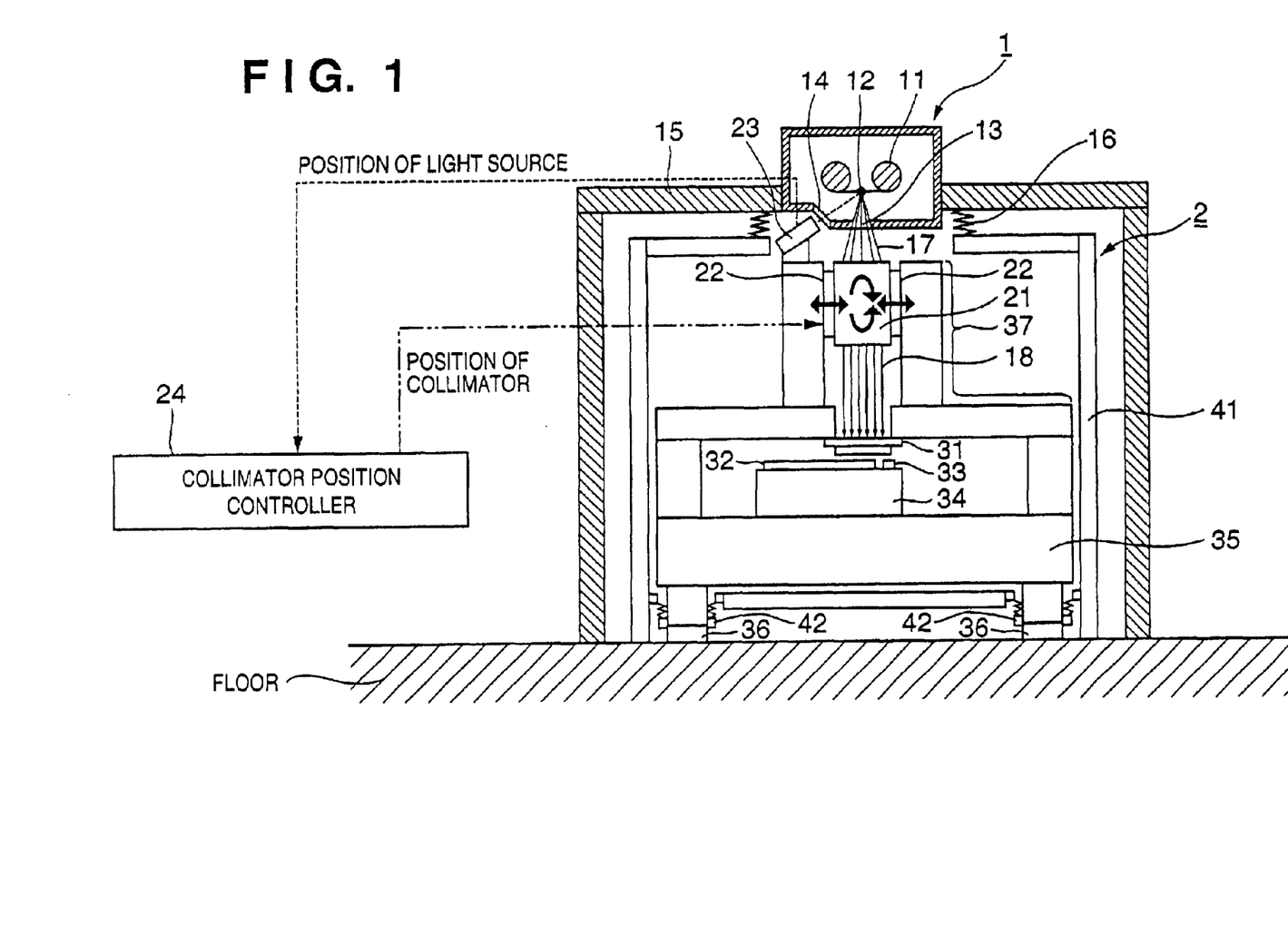
FIG. 1 is a view showing an X-ray exposure apparatus according to the first embodiment of the present invention.

FIG. 1 shows the schematic arrangement of a point source X-ray stepper according to the first embodiment. In the first embodiment, the present invention is applied to a proximity X-ray exposure apparatus using a point source light source.

Reference numeral 1 in FIG. 1 denotes an X-ray source unit for generating X-rays. The interior of the X-ray source unit 1 is maintained in a vacuum state. The X-ray source unit 1 irradiates a target 11 with a laser beam (not shown) to generate a plasma, thus generating X-rays 17. The X-rays 17 globally diverge from a light source 12. Part of the X-rays 17 is guided into a reduced-pressure He chamber 41 through an X-ray extracting window 13. A collimator 21 is set in the reduced-pressure He chamber 41. The collimator 21 sets the incident divergent X-rays to be parallel, and outputs them at an exposure field (reference numeral 18). The X-rays 17 generated by the light source 12 are divergent light beams. At an exposure position away from the light source 12, the intensity of the X-rays 17 decreases in inverse proportion to the distance. Hence, to obtain X-rays as much as possible to increase the intensity of the X-rays for exposure is one of the roles of the collimator 21. A mask 31 has a transfer pattern on its membrane (not shown). A wafer 32 coated with a photosensitive agent is positioned at a position with a small gap of about 10 μm from the mask 31. The wafer 32 is irradiated with the X-rays 18 emerging from the collimator 21, so the pattern is transferred to the wafer 32. The wafer 32 is sequentially stepped by a wafer stage 34 and is exposed successively.

The apparatus arrangement will be described in detail hereinafter.

The apparatus is mainly comprised of the light source unit 1 and a main body 2. The X-ray source unit 1 is set on a light source unit frame 15 and is installed on the floor independently of the main body 2. This prevents heat generated by the light source 12 from being transmitted through the frame to thermally distort the main body 2, leading to a decrease in alignment precision of the mask 31 and wafer 32. This also facilitates installation of the apparatus by supporting the X-ray source unit 1 and main body 2 by different structures. The target 11 is arranged in the X-ray source unit 1, and is irradiated with a laser beam (not shown) to generate a plasma, thereby generating the X-rays 17. The interior of the X-ray source unit 1 is a vacuum, and is isolated from the reduced-pressure He atmosphere of the main body 2 by the Be-made X-ray extracting window 13 with a thickness of several μm. Thus, the vacuum atmosphere in the X-ray source unit 1 will not be spoiled. Beryllium has a high X-ray transmittance but does not transmit He, so Beryllium is used to form the X-ray extracting window.

A bellows A (reference numeral 16) is set between the X-ray source unit 1 and reduced-pressure He chamber 41 to isolate them from the outside. A visible light extracting window 14 for transmitting visible light to be perpendicular to the position of the light source 12 is attached on the outer wall of the X-ray source unit 1. The visible light extracting window 14 is made of glass, and can extract visible light to the outside of the X-ray source unit 1 without spoiling the vacuum. A light source position sensor 23 senses the visible light generated by the light source 12 through the visible light extracting window 14, and measures the position of the light source 12.

The main body 2 is set in the reduced-pressure He chamber 41, and is entire maintained within the reduced-pressure He chamber by an He atmosphere creating unit (not shown). This is because attenuation of the X-rays can be suppressed by setting the atmosphere where the X-rays as the exposure light pass to reduced-pressure He. The main body 2 is comprised of the collimator 21 of an illumination optical system, a mask stage (not shown) for holding and positioning the mask 31, the wafer stage 34 for holding, positioning, and stepping the wafer 32, a transfer system (not shown) for transferring the mask 31 and wafer 32, and a measurement system (not shown) for measuring the positions of the mask 31 and wafer 32. The main body 2 is installed on the floor through vibration damping units 36.

A stage surface plate 35 is set on the vibration damping units 36, and the wafer stage 34 moves on it two-dimensionally. The wafer stage 34 holds the wafer 32 and positions it with respect to the mask 31. An X-ray intensity sensor 33 is mounted on the wafer stage 34 and can measure the exposure intensity distribution within the exposure field by moving the wafer stage 34. A main body frame 37 is set on the stage surface plate 35, and the collimator 21 is set on the main body frame 37. The position and attitude (orientation) of the collimator 21 can be freely changed by actuators 22.

The light source position sensor 23 (described above) is also fixed to the main body frame 37. More specifically, the light source position sensor 23 is mounted on the same structure as that of the mask 31 and wafer 32. The light source position sensor 23 measures the position of the light source. The measurement result is transmitted to a collimator position controller 24. The collimator position controller 24 transmits a driving command to the actuators 22, so the position of the collimator 21 is controlled.

The vibration damping units 36 prevent the positioning precisions of the mask 31 and wafer 32, that require precise positioning, from being decreased by vibration from the floor, so the main body 2 maintains a constant attitude. As the vibration damping units 36 are formed of pneumatic springs, it is difficult to remove low-frequency vibration (vibration of several Hz or less) with them. Bellows B (reference numeral 42) are set between the reduced-pressure He chamber 41 and main body 2 so the reduced-pressure He atmosphere will not be spoiled when the attitude of the main body 2 changes.

The operations of the light source position sensor 23 and collimator position controller 24 will be described.

After the apparatus is assembled, X-rays are emitted, and the intensity distribution within the exposure field is measured by the X-ray intensity sensor 33 on the wafer stage 34. Intensity distribution measurement is repeatedly performed by sequentially changing the position and attitude of the collimator 21. The relationship between the intensity distribution within the exposure field and the attitude and position of the collimator 21 is stored in the collimator position controller 24. The collimator position controller 24 outputs commands to the actuators 22 in order to perform position control such that the collimator 21 is positioned with such position and attitude that the intensity within the exposure field becomes uniform.

While the apparatus operates and exposure takes place, the light source position sensor 23 constantly measures the position of the light source 12, and the collimator position controller 24 controls the position and attitude of the collimator 21 on the basis of the data of the intensity distribution measured in advance described above, so that the intensity distribution of the exposure light within the exposure field becomes uniform.

The wafer stage 34 repeats stepping to expose the entire wafer 32. Each time the wafer stage 34 is stepped, it repeats acceleration and deceleration. Thus, a reaction force is generated to swing the main body 2, thus changing the positions of the light source 12 and main body 2 relative to each other. As the light source position sensor 23 is fixed on the main body 2 as described above, it measures the positions of the light source 12 and mask 31 relative to each other. By controlling the attitude of the collimator 21, exposure can be performed with illumination light having a uniform intensity distribution regardless of the attitude of the main body 2. Hence, stepping need not wait until the main body 2 is restored to its initial attitude. As a result, the wafer can be exposed within a shorter period of time without decreasing the line width performance, so that the throughput can be improved.

As the X-ray source unit 1 is set on a frame different from that for the main body 2, the positions of the light source 12 and main body 2 (collimator 21) relative to each other are changed by an external temperature change or the like. With the above arrangement, however, the position of the collimator 21 can always be controlled with respect to the position of the light source 12 such that the intensity distribution becomes uniform within the exposure field, thereby maintaining the resolution performance.

In this embodiment, the light source position sensor 23 measures the position of the light source 12 by sensing visible light generated by the light source 12. If the position of the light source 12 is measured by any other means, no problem arises. In the description, an expression "the intensity becomes uniform" is employed. Note that the intensity need not be strictly uniform, but the intensity distribution must fall within an allowable range.

[Second Embodiment]

Figure 2:
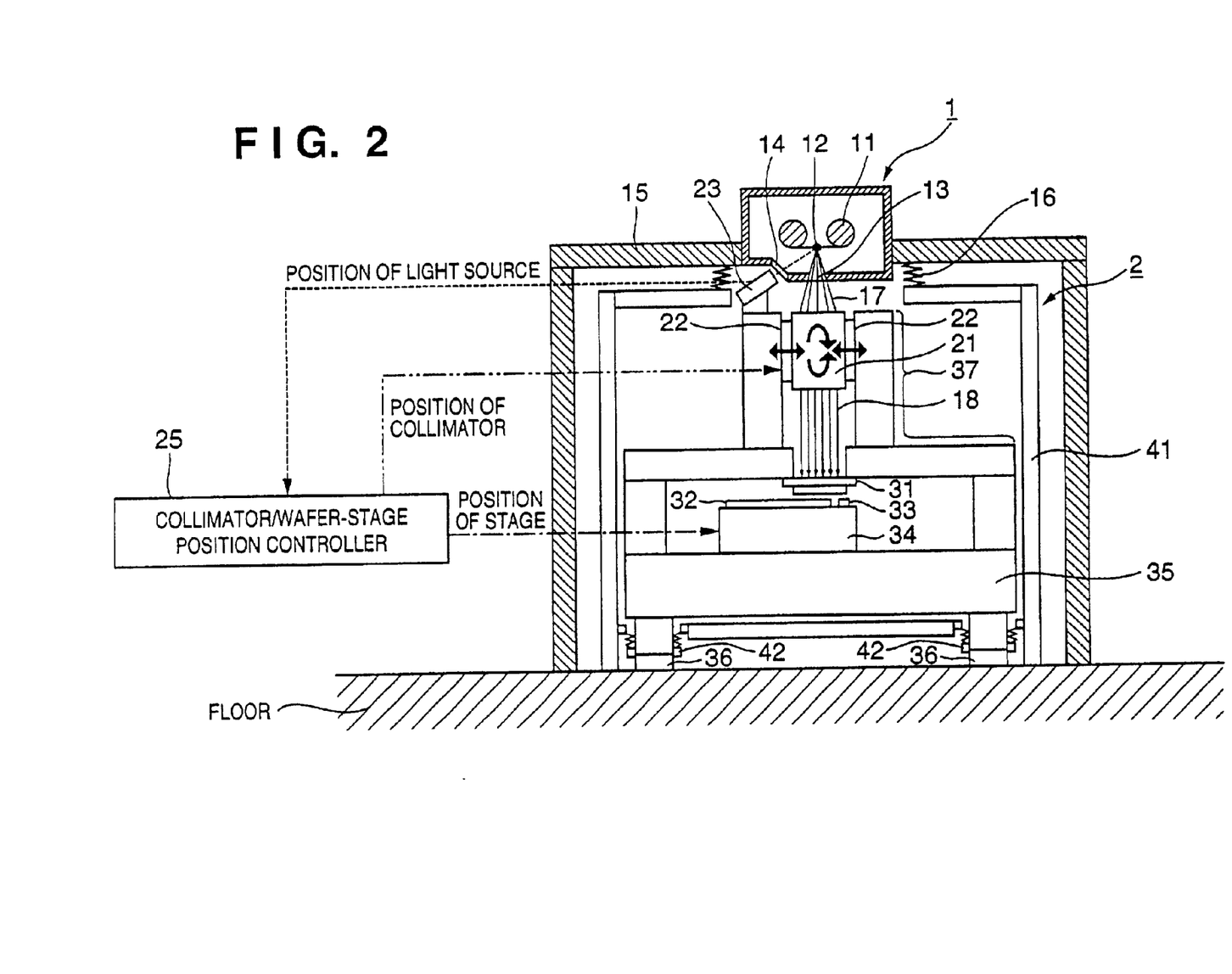
FIG. 2 is a view showing an X-ray exposure apparatus according to the second embodiment of the present invention.

FIG. 2 shows an exposure apparatus according to the second embodiment of the present invention. The same constituent elements as those of the first embodiment are denoted by the same reference numerals as in the first embodiment, and a detailed description thereof will be omitted. A light source position sensor 23 transmits a measurement signal to a collimator/wafer-stage position controller 25. The collimator/wafer-stage position controller 25 controls the position and attitude of a collimator 21 in accordance with the measured position of a light source 12, while correcting alignment of a mask 31 and wafer 32.

The operations of the light source position 23 and collimator/wafer-stage position controller 25 will be described.

After the apparatus is assembled, X-rays are emitted, and the intensity distribution within the exposure field is measured by an X-ray intensity sensor 33 on a wafer stage 34. Intensity distribution measurement is repeatedly performed by sequentially changing the position and attitude of the collimator 21. The relationship between the intensity distribution within the exposure field and the attitude and position of the collimator 21 is stored in the collimator/wafer-stage position controller 25. The collimator/wafer-stage position controller 25 outputs commands to actuators 22 in order to perform position control such that the collimator 21 is positioned with such position and attitude that the intensity within the exposure field becomes uniform. This position of the collimator 21 is determined as the initial position. A change in exposure optical axis, which takes place when the position of the collimator 21 is changed, is also measured. The optical axis is measured by setting a pinhole at the mask position and measuring the position of exposure light passing through the pinhole with the X-ray intensity sensor 33. The relationship between the exposure optical axis and the position and attitude of the collimator 21 is also stored in the collimator/wafer-stage position controller 25 in the same manner as the intensity distribution is.

While the apparatus operates and exposure takes place, the light source position sensor 23 constantly measures the position of the light source 12, and the collimator/wafer-stage position controller 25 controls the position and attitude of the collimator 21 on the basis of the data of the intensity distribution measured in advance, as described above, so that the intensity distribution of the exposure light within the exposure field becomes uniform. Furthermore, the collimator/wafer-stage position controller 25 calculates a change in optical axis on the basis of the data on the change of the exposure optical axis measured in advance, and corrects the wafer position such that the transfer error of the mask pattern onto the wafer surface, which occurs upon a change in optical axis, is corrected. For example, when the change in optical axis is 1 mrad and the exposure gap between the mask and wafer is 15 $\mu$m, correction of 15 nm is performed.

The wafer stage 34 repeats stepping to expose the entire wafer 32. Each time the wafer stage 34 is stepped, it repeats acceleration and deceleration. Thus, a reaction force is generated to swing a main body 2, thus changing the positions of the light source 12 and main body 2 relative to each other. As the light source position sensor 23 is fixed on the main body 2 as described above, it measures the positions of the light source 12 and mask 31 relative to each other. By controlling the attitude of the collimator 21, exposure can be performed with illumination light having a uniform intensity distribution regardless of the attitude of the main body 2. Hence, stepping need not wait until the main body 2 is restored to its initial attitude. As a result, the wafer 32 can be exposed within a shorter period of time without decreasing the line width performance, so that the throughput can be improved. Even when a change occurs in the exposure optical axis due to the position and attitude of the collimator 21, if positioning of the wafer stage is corrected, the overlay accuracy is not decreased.

As the X-ray source unit 1 is set on a frame different from that for the main body 2, the positions of the light source 12 and main body 2 (collimator 21) relative to each other are changed by an external temperature change or the like. With the above arrangement, however, the position of the collimator 21 can always be controlled with respect to the position of the light source 12 such that the intensity distribution becomes uniform within the exposure field, thereby maintaining the resolution performance. Even when a change occurs in the exposure optical axis due to the position and attitude of the collimator 21, if positioning of the wafer stage 34 is corrected, the overlay accuracy is not decreased.

In this embodiment, the light source position sensor 23 measures the position of the light source 12 by sensing visible light generated by the light source 12. If the position of the light source 12 is measured by any other means, no problem arises. In the description, an expression "the intensity becomes uniform" is employed. Note that the intensity need not be strictly uniform, but the intensity distribution must fall within an allowable range.

[Embodiment of a Semiconductor Production System]

Next, an example of a semiconductor device (e.g., a semiconductor chip of IC, LSI or the like, a liquid crystal panel, a CCD, a thin film magnetic head, a micromachine, etc.) production system using the apparatus of the present invention will be described. The system performs maintenance services such as trouble shooting, periodical maintenance or software delivery for fabrication apparatuses installed in a semiconductor manufacturing factory by utilizing a computer network outside the fabrication factory.

Figure 4:
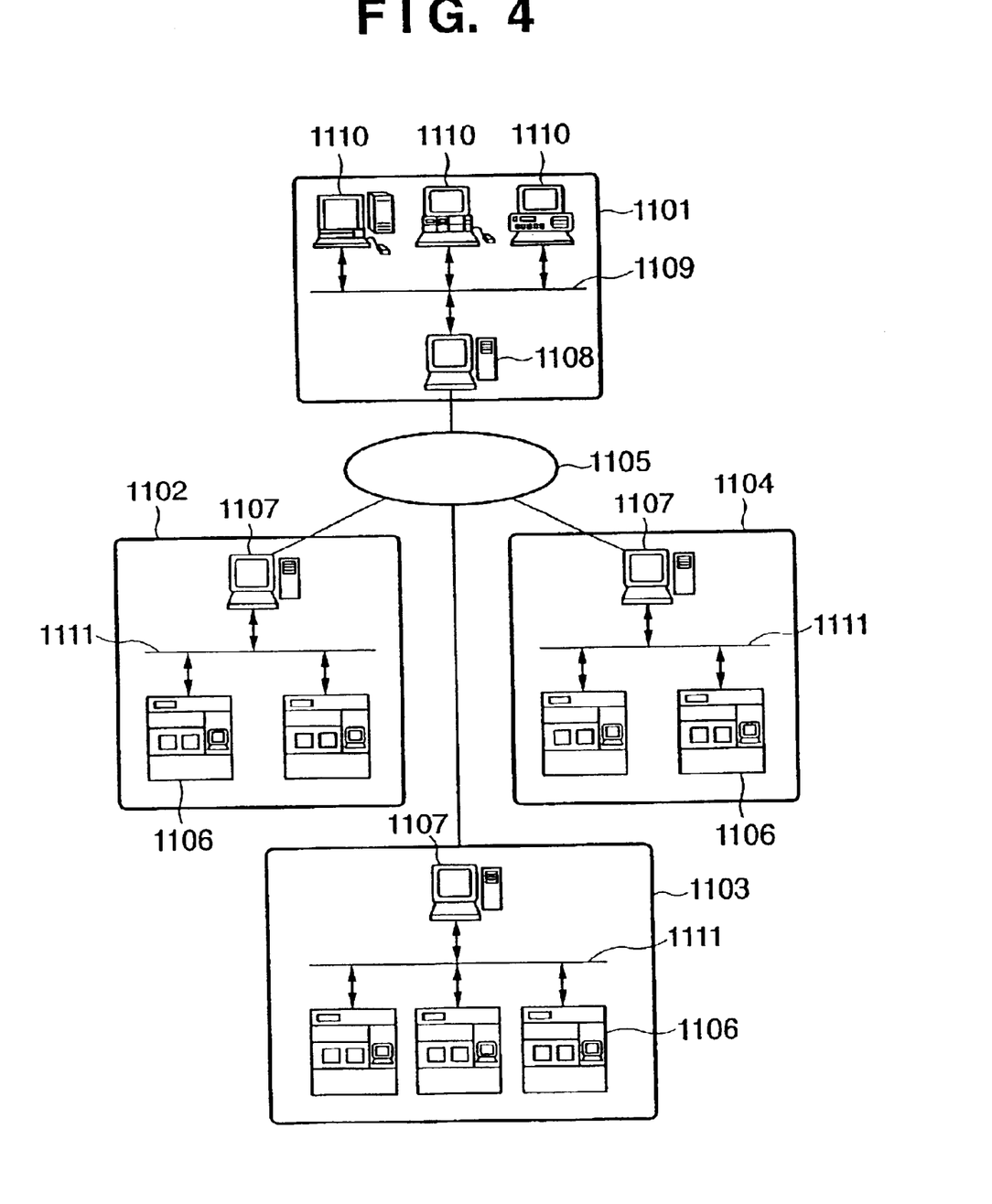
FIG. 4 is a conceptual diagram of a semiconductor device production system using the apparatus according to the embodiment, viewed from an angle.

FIG. 4 shows the entire system cut out from an angle. In the figure, numeral 1101 denotes the office of a vendor (apparatus maker) of semiconductor device fabrication apparatuses. As the semiconductor fabrication apparatuses, apparatuses in the semiconductor fabrication factory for performing various processes such as preprocess apparatuses (lithography apparatuses including an exposure apparatus, a resist processing apparatus and an etching apparatus, a heat processing apparatus, a film forming apparatus, a smoothing apparatus and the like) and postprocess apparatuses (an assembly apparatus, an inspection apparatus and the like) are used. The office 1101 has a host management system 1108 to provide a maintenance database for the fabrication apparatus, plural operation terminal computers 1110, and a local area network (LAN) 1109 connecting them to construct an Intranet or the like. The host management system 1108 has a gateway for connection between the LAN 1109 and the Internet 1105 as an external network and a security function to limit access from the outside.

On the other hand, numerals 1102 to 1104 denote fabrication factories of semiconductor makers as users of the fabrication apparatuses. The fabrication factories 1102 to 1104 may belong to different makes or may belong to the same maker (e.g., preprocess factories and postprocess factories). The respective factories 1102 to 1104 are provided with plural fabrication apparatuses 1106, a local area network (LAN) 1111 connecting the apparatuses to construct an Intranet or the like, and a host management system 1107 as a monitoring apparatus to monitor operating statuses of the respective fabrication apparatuses 1106. The host management system 1107 provided in the respective factories 1102 to 1104 has a gateway for connection between the LAN 1111 and the Internet 1105 as the external network. In this arrangement, the host management system 1108 on the vendor side can be accessed from the LAN 1111 in the respective factories via the Internet 1105, and only limited user(s) can access the system by the security function of the host management system 1108. More particularly, status information indicating the operating statuses of the respective fabrication apparatuses 1106 (e.g., problem of fabrication apparatus having trouble) is notified from the factory side to the vendor side via the Internet 1105, and maintenance information such as response information to the notification (e.g., information indicating measure against the trouble, or remedy software or data), latest software, help information and the like is received from the vendor side via the Internet. The data communication between the respective factories 1102 to 1104 and the vendor 1101 and data communication in the LAN 1111 of the respective factories are performed by using a general communication protocol (TCP/IP). Note that as the external network, a private-line network (e.g., an ISDN or the like) with high security against access from the outsiders may be used in place of the Internet.

Further, the host management system is not limited to that provided by the vendor, but a database constructed by the user may be provided on the external network, to provide the plural user factories with access to the database.

Figure 5:
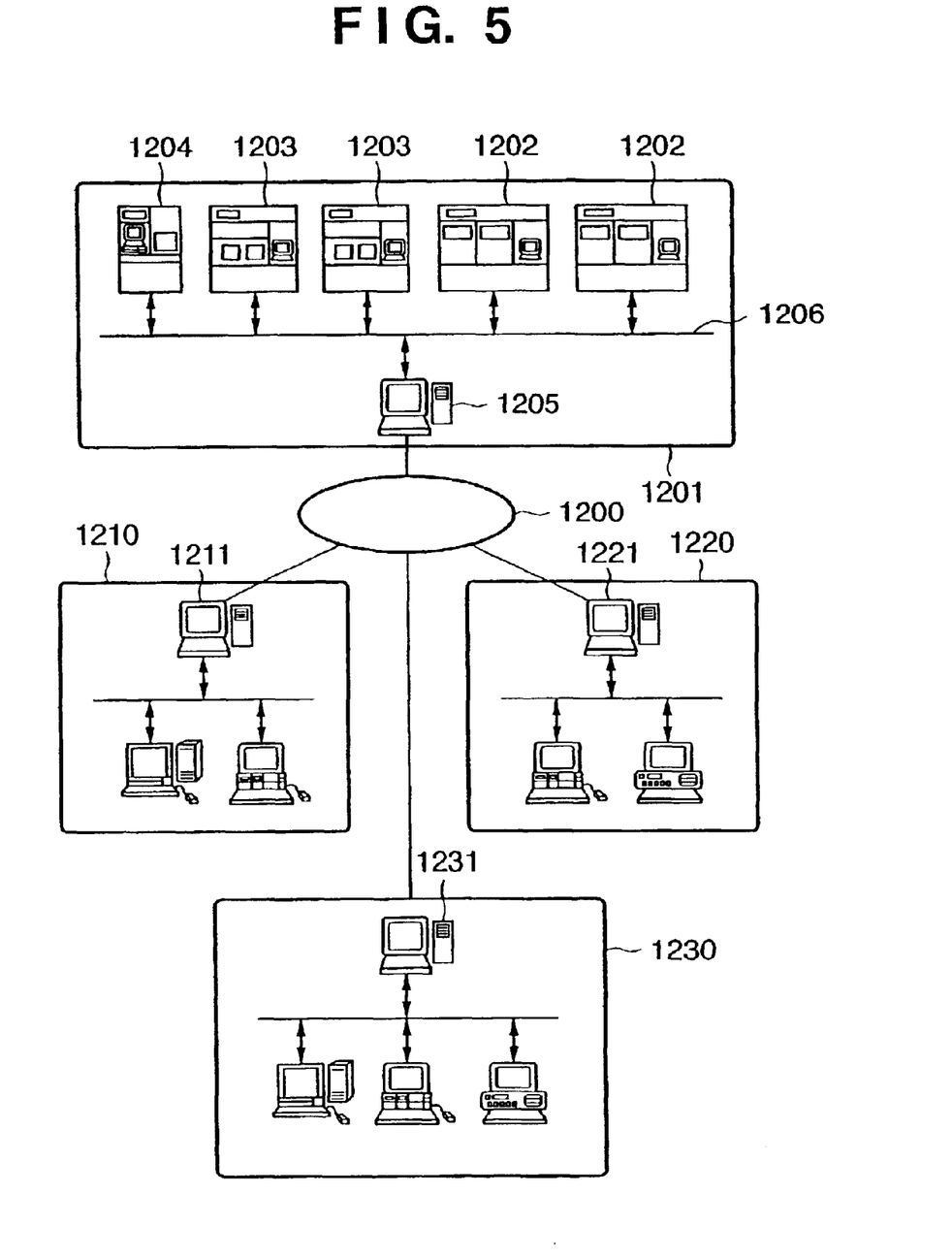
FIG. 5 is a conceptual diagram of the semiconductor device production system using the apparatus according to the embodiment, viewed from another angle.

FIG. 5 is a conceptual diagram showing the entire system of the present embodiment cut out from another angle different from that in FIG. 4. In the above example, the plural user factories respectively having fabrication apparatuses and the management system of the apparatus vendor are connected via the external network, and data communication is performed for production management for the respective factories and transmission of information on at least one fabrication apparatus. In this example, a factory having fabrication apparatuses of plural vendors is connected with a management system of the respective vendors of the fabrication apparatuses via the external network, and data communication is performed for transmission of maintenance information for the respective fabrication apparatuses. In the figure, numeral 1201 denotes a fabrication factory of a fabrication apparatus user (semiconductor device maker). In the factory fabrication line, fabrication apparatuses for performing various processes, an exposure apparatus 1202, a resist processing apparatus 1203 and a film forming apparatus 1204, are used. Note that FIG. 5 shows only the fabrication factory 1201, however, actually, plural factories construct the network. The respective apparatuses of the factory are connected with each other by a LAN 1206 to construct an Intranet, and a host management system 1205 performs operation management of the fabrication line.

On the other hand, the respective offices of vendors (apparatus makers), an exposure apparatus maker 1210, a resist processing apparatus maker 1220, and a film forming apparatus maker 1230 have host management systems 1211, 1221 and 1231 for remote maintenance for the apparatuses, and, as described above, the systems have the maintenance database and the gateway for connection to the external network. The host management system 1205 for management of the respective apparatuses in the user fabrication factory is connected with the respective vendor management systems 1211, 1221 and 1231 via the Internet or private-line network as an external network 1200. In this system, if one of the fabrication apparatuses of the fabrication line has trouble, the operation of the fabrication line is stopped. However, the trouble can be quickly removed by receiving the remote maintenance service from the vendor of the apparatus via the Internet 1200, thus the stoppage of the fabrication line can be minimized.

Figure 6:
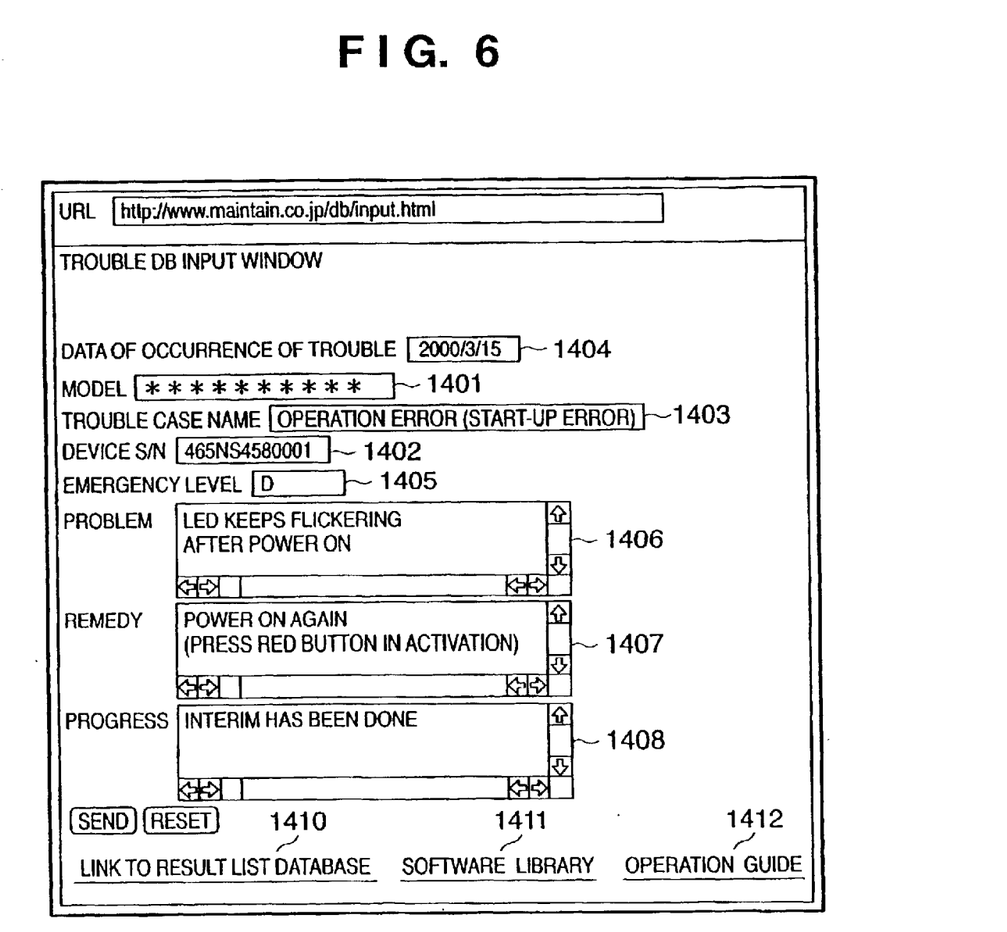
FIG. 6 is a particular example of a user interface.

The respective fabrication apparatuses installed in the semiconductor fabrication factory have a display, a network interface and a computer to execute network access software stored in a memory and device operation software. As a memory, an internal memory, a hard disk or a network file server may be used. The network access software, including a specialized or general web browser, provides a user interface screen image as shown in FIG. 6 on the display. An operator who manages the fabrication apparatuses in the factory checks the screen image and inputs information of the fabrication apparatus, a model 1401, a serial number 1402, a trouble case name 1403, a date of occurrence of trouble 1404, an emergency level 1405, a problem 1406, a remedy 1407 and a progress 1408, into input fields on the screen image. The input information is transmitted to the maintenance database via the Internet, and appropriate maintenance information as a result is returned from the maintenance database and provided on the display. Further, the user interface provided by the web browser realizes hyper link functions 1410 to 1412 as shown in the figure, and the operator accesses more detailed information of the respective items, downloads latest version software to be used in the fabrication apparatus from a software library presented by the vendor, and downloads operation guidance (help information) for the operator's reference. The maintenance information provided from the maintenance database includes the information on the above-described present invention, and the software library provides latest version software to realize the present invention.

Figure 7:
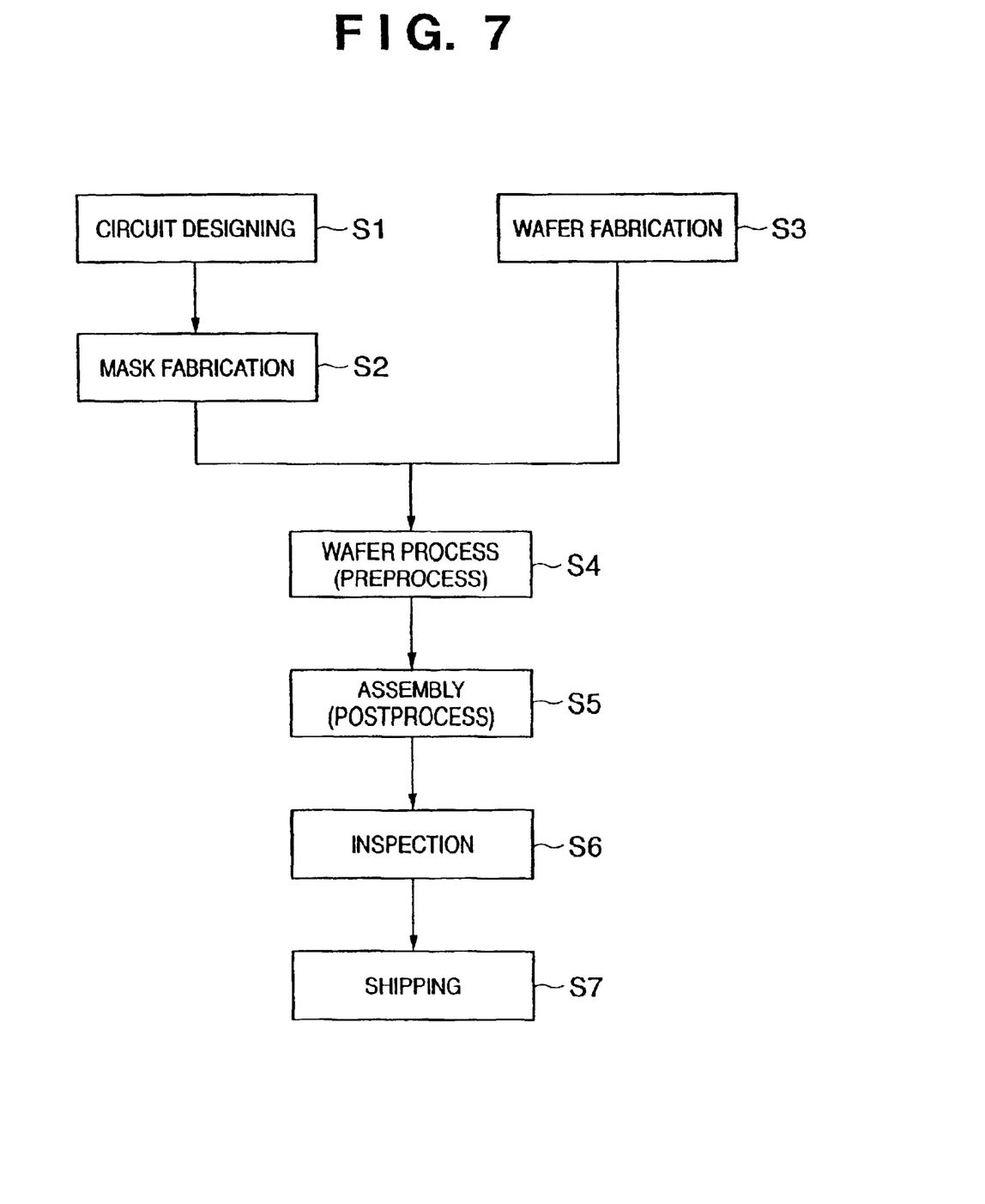
FIG. 7 is a flowchart showing device fabrication process.

Next, a semiconductor device fabrication process utilizing the above-described production system will be described. FIG. 7 shows a flow of the entire semiconductor fabrication process. At step S1 (circuit designing), a circuit designing of the semiconductor device is performed. At step S2 (mask fabrication), a mask where the designed circuit pattern is formed is fabricated. On the other hand, at step S3 (wafer fabrication), a wafer is fabricated using silicon or the like. At step S4 (wafer process) called a preprocess, the above mask and wafer are used. An actual circuit is formed on the wafer by lithography. At step S5 (assembly) called a postprocess, a semiconductor chip is formed by using the wafer at step S4. The postprocess includes processing such as an assembly process (dicing and bonding) and a packaging process (chip sealing). At step S6 (inspection), inspections such as an operation test and a durability test are performed on the semiconductor device assembled at step S5. The semiconductor device is completed through these processes, and it is shipped (step S7). The preprocess and the postprocess are independently performed in specialized factories, and maintenance is made for these factories by the above-described remote maintenance system. Further, data communication is performed for production management and/or apparatus maintenance between the preprocess factory and the postprocess factory via the Internet or private-line network.

Figure 8:
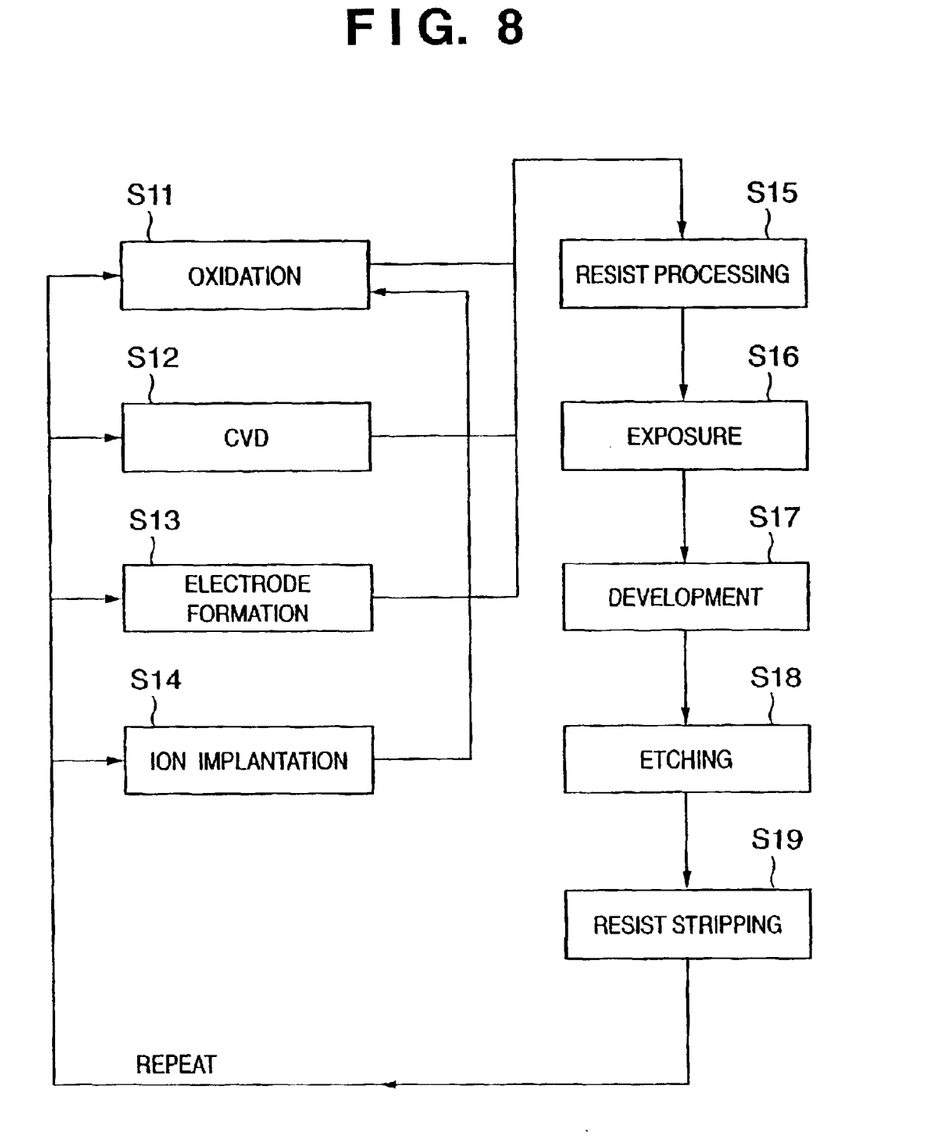
FIG. 8 is a flowchart showing a wafer process.

FIG. 8 shows a more detailed flow of the wafer process. At step S11 (oxidation), the surface of the wafer is oxidized. At step S12 (CVD), an insulating film is formed on the surface of the wafer. At step S13 (electrode formation), electrodes are formed by vapor deposition on the wafer. At step S14 (ion implantation), ions are injected into the wafer. At step S15 (resist processing), the wafer is coated with a photoresist. At step S16 (exposure), the above-described exposure apparatus exposure-transfers the circuit pattern of the mask onto the wafer. At step S17 (development), the exposed wafer is developed. At step S18 (etching), portions other than the resist image are etched. At step S19 (resist stripping), the resist unnecessary after the etching is removed. These steps are repeated, thereby multiple circuit patterns are formed on the wafer. As maintenance is performed on the fabrication apparatuses used in the respective steps by the above-described remote maintenance system, trouble is prevented, and even if it occurs, quick recovery can be made. In comparison with the conventional art, the productivity of the semiconductor device can be improved.

The present invention is not limited to the above embodiments and various changes and modifications can be made within the spirit and scope of the present invention. Therefore, to apprise the public of the scope of the present invention, the following claims are made.

What is claimed is:

1. An X-ray exposure apparatus for transferring a mask pattern onto a substrate, said apparatus comprising:
   an X-ray source for generating X-rays;
   an optical system which includes a collimator for generating parallel X-rays for transferring a mask pattern to a substrate, from said X-ray source;
   a detection unit which detects a position of the X-ray source relative to a mask; and
   a correction unit which corrects a position and an attitude of the optical system on the basis of a detection result obtained by said detection unit.

2. The apparatus according to claim 1, wherein said correction unit corrects the position and attitude of the optical system by unifying an exposure intensity within a predetermined allowable range.

3. The apparatus according to claim 1, wherein said correction unit corrects positions of the mask and substrate relative to each other on the basis of the detection result obtained by said detection unit.

4. An apparatus according to claim 1, wherein the exposure apparatus is a proximity X-ray exposure apparatus.

5. An X-ray exposure method which transfers a mask pattern onto a substrate, said method comprising the steps of:
   generating X-rays from an X-ray source;
   generating parallel X-rays for transferring a mask pattern to a substrate, from the X-ray source, by an optical system which includes a collimator;
   detecting a position of the X-ray source relative to a mask; and
   correcting a position and an attitude of the optical system on the basis of a detection result obtained in said detecting step.

6. The method according to claim 5, wherein correction is performed such that an exposure intensity becomes uniform with a predetermined allowable range.

7. The method according to claim 5, wherein positions of the mask and substrate relative to each other are corrected on the basis of the detection result.

8. The method according to claim 5, wherein exposure is proximity X-ray exposure.

9. A semiconductor device fabricating method comprising the steps of:

setting, in a semiconductor fabrication factory, a group of fabrication apparatuses for performing respective types of processes, the group of fabrication apparatuses including an exposure apparatus comprising:
(i) an X-ray source for generating X-rays;
(ii) an optical system which includes a collimator lens for generating parallel X-rays for transferring a mask pattern to a substrate, from the X-ray source;
(iii) a detection unit which detects a position of the X-ray source relative to a mask;
(iv) a correction unit which corrects a position and an attitude of the optical system on the basis of a detection result obtained by the detection unit; and fabricating a semiconductor device in accordance with a plurality of processes by using the group of fabrication apparatuses.

10. The method according to claim 9, further comprising the steps of:

connecting the group of fabrication apparatuses to each other through a local area network; and data-communicating information on at least one of the group of fabrication apparatuses between the local area network and an external network outside the semiconductor fabrication factory.

11. The method according to claim 10, further comprising performing one of (i) obtaining maintenance information on the fabrication apparatuses through data communication by accessing a database provided by a vendor or user of the exposure apparatus through the external network, and (ii) production management by data communication with another semiconductor manufacturing factory through the external network.

12. A semiconductor fabrication factory comprising:

a group of fabrication apparatuses, for performing respective types of processes, including the exposure apparatus according to claim 1;

a local area network for connecting the group of fabrication apparatuses; and a gateway for enabling access to an external network outside the factory from the local area network, wherein data communication of information on at least one of the group of fabrication apparatuses is enabled.

13. A maintenance method for an exposure apparatus comprising:
(i) an X-ray source for generating X-rays;
(ii) an optical system which includes a collimator lens for generating parallel X-rays for transferring a mask pattern to a substrate, from the X-ray source;
(iii) a detection unit which detects a position of the X-ray source relative to a mask;
(iv) a correction unit which corrects a position and an attitude of the optical system on the basis of a detection result obtained by the detection unit, the exposure apparatus being set on a semiconductor fabrication factory, said method comprising the steps of:

providing, by a vendor or user of the exposure apparatus, a maintenance database connected to an external network outside the semiconductor fabrication factory;

allowing access to the maintenance database from inside the semiconductor fabrication factory through the external network; and transmitting maintenance information accumulated in the maintenance database to the semiconductor fabrication factory through the external network.

14. The exposure apparatus claim 1, further comprising a display, a network interface, and a computer for performing network software, wherein data communication of maintenance information on the exposure apparatus through a computer network is enabled.

15. The exposure apparatus according to claim 14, wherein the network software provides a user interface for accessing a maintenance database, connected to an external network outside a factory where the exposure apparatus is set and provided by a vendor or user of the exposure apparatus, on the display, so information can be obtained from the database through the external network.

* * * * *

UNITED STATES PATENT AND TRADEMARK OFFICE
CERTIFICATE OF CORRECTION

PATENT NO. : 6,754,303 B2
DATED : June 22, 2004
INVENTOR(S) : Kazuyuki Kasumi et al.

It is certified that error appears in the above-identified patent and that said Letters Patent is hereby corrected as shown below:

Title page,
Item [56], References Cited, U.S. PATENT DOCUMENTS, delete the following:
"5,453,001 A   9/1995  Huang…………………………..378/34".

Column 6,
Line 41, "entire" should read -- entirely --.

Column 8,
Line 44, "distribution" should read -- distribution. -- and "is." should be deleted.

Column 13,
Line 8, "lens" should be deleted.

Column 14,
Line 6, "lens" should be deleted.
Line 28, "apparatus claim 1," should read -- apparatus according to claim 1, --.

Signed and Sealed this

Eighth Day of February, 2005

JON W. DUDAS
*Director of the United States Patent and Trademark Office*